(12) United States Patent
Wang et al.

(10) Patent No.: US 10,424,247 B2
(45) Date of Patent: Sep. 24, 2019

(54) AMOLED DRIVING CIRCUIT AND AMOLED DISPLAY DEVICE

(71) Applicant: Shenzhen China Star Optoelectronics Technology Co., Ltd., Shenzhen, Guangdong (CN)

(72) Inventors: Zhenling Wang, Guangdong (CN); Tai-jiun Hwang, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 146 days.

(21) Appl. No.: 15/541,367

(22) PCT Filed: May 25, 2017

(86) PCT No.: PCT/CN2017/085863
§ 371 (c)(1),
(2) Date: Jul. 1, 2017

(87) PCT Pub. No.: WO2018/196077
PCT Pub. Date: Nov. 1, 2018

(65) Prior Publication Data
US 2018/0315373 A1 Nov. 1, 2018

(51) Int. Cl.
| G09G 3/3258 | (2016.01) |
| G09G 3/325 | (2016.01) |
| H01L 27/32 | (2006.01) |
| G09G 3/3233 | (2016.01) |

(52) U.S. Cl.
CPC .......... *G09G 3/3258* (2013.01); *G09G 3/325* (2013.01); *G09G 3/3233* (2013.01); *H01L 27/3244* (2013.01); *G09G 2300/0861* (2013.01); *G09G 2310/0264* (2013.01);
(Continued)

(58) Field of Classification Search
CPC .......... G09G 3/30; G09G 3/32; G09G 3/3208; G09G 3/3225; G09G 3/3233; G09G 3/325; G09G 3/3258; G09G 3/3291; G09G 2300/0819; G09G 2300/0861; G09G 2310/0264; G09G 2310/0291; G09G 2310/08; G09G 2320/0295;
(Continued)

(56) References Cited

U.S. PATENT DOCUMENTS

| 8,125,417 B2 | 2/2012 | Furuichi |
| 8,405,582 B2 | 3/2013 | Kim |
| 8,599,224 B2 | 12/2013 | Yoo |

(Continued)

*Primary Examiner* — Keith L Crawley
(74) *Attorney, Agent, or Firm* — Andrew C. Cheng (57) ABSTRACT

The disclosure discloses an AMOLED driving circuit and a display device. The driving circuit includes a pixel circuit, a digital driving circuit, and a detection circuit. The pixel circuit includes a data cable and a first switch element. The data cable and the first switch element are coupled. The digital driving circuit is coupled with the data cable, configured to provide a digital voltage signal to the pixel circuit by the data cable. The detection circuit is coupled with the data cable, configured to receive and output the current fed back from the data cable and flowing through the first switch element. The current is configured to compensate a threshold voltage of the first switch element. According to the manner above, embodiments provided by the disclosure can enhance the display effect of the AMOLED.

8 Claims, 3 Drawing Sheets

(52) U.S. Cl.
CPC ............... *G09G 2320/0295* (2013.01); *G09G 2320/043* (2013.01); *G09G 2320/0693* (2013.01)

(58) Field of Classification Search
CPC ....... G09G 2320/043; G09G 2320/045; G09G 2320/0693; H01L 27/3244; H01L 27/3262
See application file for complete search history.

(56) References Cited

U.S. PATENT DOCUMENTS

| | | | |
|---|---|---|---|
| 9,430,968 B2 | 8/2016 | Kishi | |
| 9,524,678 B2 | 12/2016 | Bae | |
| 9,626,035 B2 | 4/2017 | Tan | |
| 9,652,095 B2 | 5/2017 | Yang | |
| 10,062,327 B2 | 8/2018 | Tani | |
| 2008/0246785 A1* | 10/2008 | Shirasaki | G09G 3/3233 345/690 |
| 2009/0244044 A1* | 10/2009 | Furuichi | G09G 3/3283 345/211 |
| 2010/0045646 A1* | 2/2010 | Kishi | G09G 3/3233 345/211 |
| 2011/0205250 A1* | 8/2011 | Yoo | G09G 3/3233 345/690 |
| 2013/0155038 A1* | 6/2013 | Yamashita | G09G 3/3233 345/204 |
| 2014/0368415 A1* | 12/2014 | Kim | G09G 3/3233 345/77 |
| 2015/0029171 A1* | 1/2015 | Jo | G09G 3/3258 345/212 |
| 2016/0203764 A1* | 7/2016 | In | G09G 3/3225 345/215 |
| 2017/0061877 A1 | 3/2017 | Lee | |
| 2017/0132978 A1 | 5/2017 | Fu | |
| 2017/0162125 A1 | 6/2017 | Liang | |
| 2018/0005579 A1* | 1/2018 | Brahma | G09G 3/3258 |
| 2018/0082642 A1* | 3/2018 | Yamanaka | G09G 3/3233 |
| 2018/0151112 A1* | 5/2018 | Song | G09G 3/006 |

* cited by examiner

AMOLED DRIVING CIRCUIT AND AMOLED DISPLAY DEVICE

FIELD OF THE DISCLOSURE

The disclosure relates to a display technical field, and more particularly to an AMOLED driving circuit and a display device.

BACKGROUND

An organic light emitting diode (OLED) display device is self-luminous with low driving voltages, high light emitting efficiency and quick response, which is generally regarded as the most potential display device.

Figure 1:
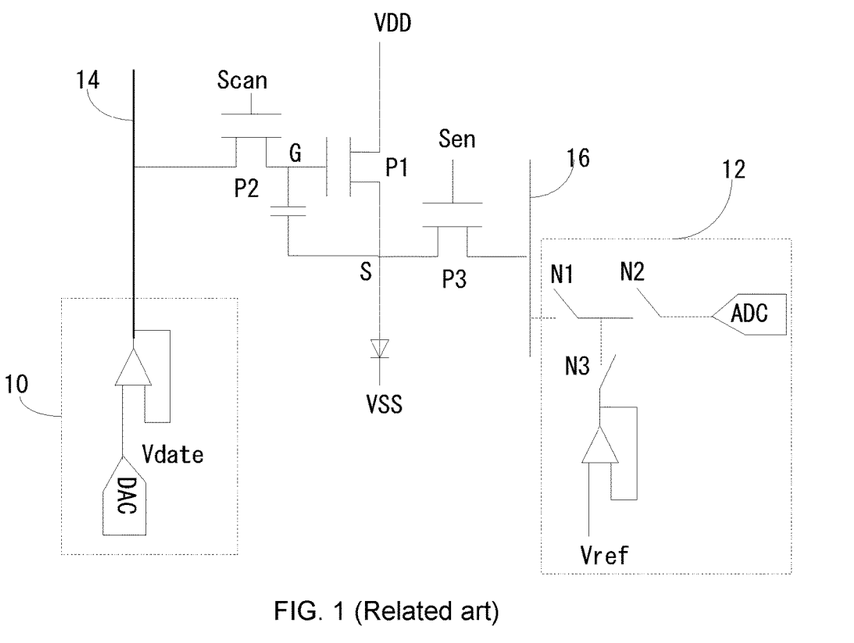
FIG. 1 is a structural schematic view of a conventional AMOLED driving circuit according to an embodiment.

OLED display devices can be classified into a passive matrix OLED (PMOLED) and an active matrix OLED (AMOLED). The AMOLED has pixels arranged as a matrix, which belongs to the active display sort, and the light emitting efficacy is high. As the thin film transistor of the driving organic light emitting diode has threshold voltage deviation, the AMOLED display device generally needs to be equipped with a detection system for detection. As shown in FIG. 1, FIG. 1 is a structural schematic view of a conventional AMOLED driving circuit in an embodiment. The AMOLED driving circuit includes a digital driving circuit 10 and a detection circuit 12. The digital driving circuit 10 and a data cable 14 are coupled, configured to provide a digital voltage signal Vdate to the driving circuit. The detection circuit 12 and a sensing line 16 are coupled, configured to detect and output the current through a driving thin film transistor T1 by the sensing line 16.

The inventor of the disclosure finds out from a long-term study that a switch N1 of the detection circuit 12 is a multiplexing module Mux, which means the detection circuit 12 can control N sensing lines 16 simultaneously, further the detection circuit 12 can control N pixels in one line simultaneously. During regular display, reference voltages Vref of each S point entered N pixels will be different due to internal impedance of the detection circuit 12, which can lead to a phenomenon of abrupt change of brightness among N pixels controlled by the same detection circuit 12 to affect the display effect of the AMOLED.

SUMMARY

The disclosure provides an AMOLED driving circuit and a display device, which can enhance the display effect of the AMOLED.

In order to solve the technical problem above, an embodiment of the disclosure provides an AMOLED driving circuit. The driving circuit includes a pixel circuit, a detection circuit, and a digital driving circuit. The pixel circuit includes an organic electroluminescent device, a data cable, a first switch element, a first capacitor, a second switch element, a third switch element, and a fourth switch element. A cathode of the organic electroluminescent device and a negative supply voltage are coupled. An anode of the organic electroluminescent device and a positive supply voltage are coupled. A control terminal of the first switch element and the data cable are coupled. A first passing terminal and the positive supply voltage are coupled. A second passing terminal of the first switch element and the anode are coupled. The first switch element is configured to drive the organic electroluminescent device to illuminate. Two ends of the first capacitor are coupled with the control terminal of the first switch element and the second passing terminal of the first switch element respectively, and coupled positions are defined as a first node and a second node respectively. A control terminal of the second switch element receives a first type scanning signal, a first passing terminal of the second switch element and the data cable are coupled. A second passing terminal of the second switch element and the first node are coupled. A control terminal of the third switch element receives the first type scanning signal. A first passing terminal of the third switch element and the second node are coupled. A second passing terminal of the third switch element and the negative supply voltage are coupled. A control terminal of the fourth switch element receives a second type scanning signal, a first passing terminal of the fourth switch element and the second node are coupled. A second passing terminal of the fourth switch element and the data cable are coupled. The first switch element, the second switch element, the third switch element, and the fourth switch element are any one of a low-temperature polysilicon thin film transistor, an oxide semiconductor thin film transistor or an amorphous silicon thin film transistor. The detection circuit is coupled with the data cable. The detection circuit is configured to receive and output a current fed back from the data cable and flowing through the first switch element. The current is configured to compensate a threshold voltage of the first switch element. The detection circuit includes a first switch coupled with the data cable, a comparator coupled with the first switch, a memorizer coupled with the comparator, a second switch coupled with the data cable, a buffer, and a third switch. The comparator is configured to compare the current fed back from the data cable and flowing through the first switch element and a prospective current to obtain a voltage difference. The memorizer is configured to receive and output the voltage difference. The buffer includes a normal-phase input terminal, a reversed-phase input terminal and an output terminal. The output terminal and the second switch are coupled. The reversed-phase input terminal and the output terminal are coupled. One end of the third switch and the normal-phase input terminal of the buffer are coupled, the other end receives an external reference voltage. The digital driving circuit is coupled with the data cable. The digital driving circuit is configured to provide a digital voltage signal to the pixel circuit by the data cable. The digital driving circuit includes a fourth switch coupled with the normal-phase input terminal of the buffer, and a digital-analog converter. One end of the digital-analog converter and the fourth switch are coupled, the other end receives the digital voltage signal. The detection circuit and the digital driving circuit share the buffer and the second switch, further coupled with the data cable of the pixel circuit. The digital driving circuit and the detection circuit are integrated into one chip to achieve functions of the digital driving circuit and the detection circuit simultaneously.

In order to solve the technical problem above, an embodiment of the disclosure provides an AMOLED driving circuit. The driving circuit includes a pixel circuit, a digital driving circuit, and a detection circuit. The pixel circuit includes a data cable, a first switch element and an organic electro-illuminant. The first switch element is configured to drive the organic electro-illuminant to illuminate. The data cable and the first switch element are coupled. The digital driving circuit is coupled with the data cable. The digital driving circuit is configured to provide a digital voltage signal to the pixel circuit by the data cable. The detection circuit is coupled with the data cable. The detection circuit is configured to receive and output a current fed back from the data cable and flowing through the first switch element. The current is configured to compensate a threshold voltage of the first switch element.

In order to solve the technical problem above, another embodiment of the disclosure provides an AMOLED display device. The display device includes a digital driving circuit, a detection circuit, a data cable and a plurality of pixels arranged as an array. The pixels include a pixel circuit. The pixel circuit includes a first switch element and an organic electro-illuminant. The first switch element is respectively coupled with the organic electro-illuminant and the data cable. The digital driving circuit is coupled with the data cable. The digital driving circuit is configured to provide a digital voltage signal to the pixel circuit by the data cable. The detection circuit is coupled with the data cable. The detection circuit is configured to receive and output a current fed back from the data cable and flowing through the first switch element. The current is configured to compensate a threshold voltage of the first switch element.

Beneficial effects of the disclosure are distinguishing from the prior art, the AMOLED driving circuit provided by the disclosure includes the detection circuit. The detection circuit and the data cable are coupled. On one hand, the detection circuit receives and outputs the current fed back from the data cable and flowing through the first switch element. The first switch element is a driving switch element of the organic electroluminescent device. The detected current is configured to subsequently compensate the threshold voltage of the first switch element, so as to enhance the display effect of the AMOLED. On the other hand, the detection circuit can simultaneously control N pixels in one column by the data cable. As the manner of progressive scanning is adopted in the AMOLED display, only one pixel is controlled by the detection circuit at one moment, which can prevent the phenomenon of abrupt change of brightness among N pixels controlled by the detection circuit and improve the display effect of the AMOLED.

DETAILED DESCRIPTION OF PREFERRED EMBODIMENTS

Figure 2:
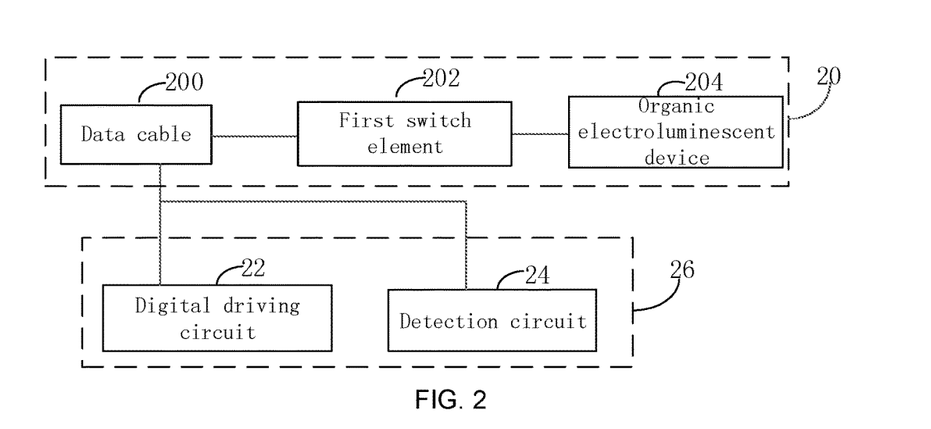
FIG. 2 is a structural schematic view of an AMOLED driving circuit according to an embodiment of the disclosure.

Referring to FIG. 2, FIG. 2 is a structural schematic view of an AMOLED driving circuit according to an embodiment of the disclosure. The driving circuit includes a pixel circuit 20, a digital driving circuit 22, and a detection circuit 24. Specifically, the pixel circuit 20 includes a data cable 200, a first switch element 202 and an organic electroluminescent device 204. The first switch element 202 is a driving switch element, configured to drive the organic electroluminescent device 204 to illuminate. The data cable 200 and the first switch element 202 are coupled. The digital driving circuit 22 is coupled with the data cable 200, configured to provide a digital voltage signal Vdate to the pixel circuit 20 by the data cable 200. The detection circuit 24 is coupled with the data cable 200, configured to receive and output a current fed back from the data cable 200 and flowing through the first switch element 202. The current is configured to subsequently compensate a threshold voltage of the first switch element 202.

The prior art mentioned in the background, referring to FIG. 1 again, the digital driving circuit 10 and detection circuit 12 are respectively integrated in two chips, which are a digital driving chip and a detection chip. In an embodiment, the driving circuit provided by the disclosure can integrate the digital driving circuit 22 and the detection circuit 24 in one chip 26 to achieve functions of the digital driving circuit 22 and the detection circuit 24 simultaneously. In other words, one chip is adopted to achieve the functions of the digital driving circuit 22 and the detection circuit 24.

Figure 3:
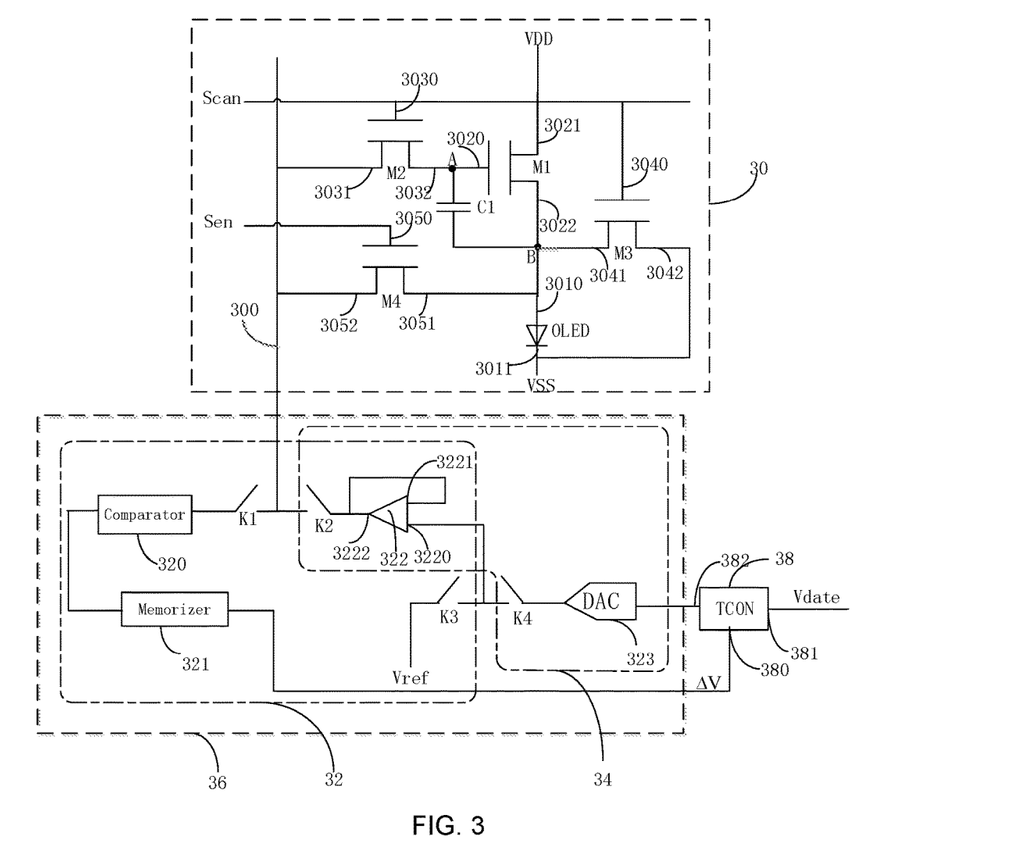
FIG. 3 is a specifically schematic circuit diagram of the AMOLED driving circuit in FIG. 2.

Referring to FIG. 3, FIG. 3 is a specifically schematic circuit diagram of the AMOLED driving circuit in FIG. 2.

The pixel circuit 30 is first introduced. An anode 3010 of the organic electroluminescent device OLED and a positive supply voltage VDD are coupled. A cathode 3011 and a negative supply voltage VSS are coupled. The first switch element M1 is a driving switch element, configured to drive the organic electroluminescent device OLED to illuminate, and coupled with the data cable 300. A control terminal 3020 of the first switch element M1 and the data cable 300 are coupled. A first passing terminal 3021 and the positive supply voltage VDD are coupled. A second passing terminal 3022 and the anode 3010 of the organic electroluminescent device OLED are coupled.

In the embodiment, the pixel circuit 30 further includes a first capacitor C1. Two ends of the first capacitor C1 are coupled with the control terminal 3020 of the first switch element M1 and the second passing terminal 3022 of the first switch element M1 respectively, and coupled positions are defined as a first node A and a second node B respectively. A control terminal 3030 of the second switch element M2 receives a first type scanning signal Scan, a first passing terminal 3031 and the data cable 300 are coupled. A second passing terminal 3032 and the first node A are coupled. A control terminal 3040 of the third switch element M3 receives the first type scanning signal Scan. A first passing terminal 3041 and the second node B are coupled. A second passing terminal 3042 and the negative supply voltage VSS are coupled. A control terminal 3050 of the fourth switch element M4 receives a second type scanning signal Sen, a first passing terminal 3051 and the second node B are coupled. A second passing terminal 3052 and the data cable 300 are coupled.

The first switch element M1, the second switch element M2, the third switch element M3, the fourth switch element M4 are low-temperature polysilicon thin film transistors, oxide semiconductor thin film transistors or amorphous silicon thin film transistors.

The detection circuit 32 includes a first switch K1 coupled with the data cable 300, a comparator 320 coupled with the first switch K1, a memorizer 321 coupled with the comparator 320, a second switch K2 coupled with the data cable 300, a buffer 322, and a third switch K3. The comparator 320 is configured to compare the current fed back from the data cable 300 and flowing through the first switch element M1 and a prospective current to obtain a voltage difference ΔV. The prospective current is the ideal current measured by the detection circuit 32 when the threshold voltage of the first switch element M1 has no deviance. An absolute value of the difference of the current I currently fed back and the prospective current $I_0$ is multiplied by a rated resistance value to obtain the voltage difference ΔV. The memorizer 321 is configured to receive and output the voltage difference ΔV. The memorizer 321 is further configured to store the voltage difference ΔV in other embodiments. The buffer 322 includes a normal-phase input terminal 3220, a reversed-phase input terminal 3221 and an output terminal 3222. The output terminal 3222 and the second switch K2 are coupled. The reversed-phase input terminal 3221 and the output terminal 3222 are coupled. The buffer 322 is an input buffer in the embodiment, configured to temporarily store data sent from external devices. One end of the third switch K3 and the normal-phase input terminal 3220 of the buffer 322 are coupled, the other end receives an external reference voltage Vref, configured to transmit the external reference voltage Vref to the buffer 322.

The detection circuit 32 can simultaneously control N pixels in one column by the data cable 300. As the manner of progressive scanning is adopted in the AMOLED display, only one pixel is controlled by the detection circuit 32 at one moment, which can prevent the phenomenon of abrupt change of brightness among N pixels controlled by the detection circuit 32 and improve the display effect of the AMOLED.

The digital driving circuit 34 includes a fourth switch K4 coupled with the normal-phase input terminal 3220 of the buffer 322, and a digital-analog converter 323. One end and the fourth switch K4 are coupled, the other end receives the digital voltage signal Vdate, configured to transmit an analogue voltage signal converted from the digital voltage signal Vdate to the buffer 322 by the fourth switch K4.

The detection circuit 32 and the digital driving circuit 34 in the embodiment described above share the buffer 322 and the second switch K2, further coupled with the data cable 300 of the pixel circuit 30. The digital driving circuit 34 and the detection circuit 32 in the embodiment are integrated into one chip 36. In some practical situations, the chip 36 includes a chip circuit, which can achieve functions of the digital driving circuit 34 and the detection circuit 32 simultaneously. The reference voltage Vref and the digital voltage signal Vdate in the embodiment of the disclosure are input in the pixel circuit 30 by the same buffer 322. Compared with the prior art, the embodiment of the disclosure can reduce the number of the buffers 322, further decreasing the area of the chip for space saving. Moreover, the data cable 300 in the disclosure play dual functions of the data cable and the detection line in the prior art, which can further reduce the amount of output pins of the chip 36 after integration.

In other embodiments, the driving circuit above further includes a sequence controller 38. The sequence controller 38 includes a first interface 380, a second interface 381, and a third interface 382. The first interface 380 and the memorizer 321 are coupled, configured to receive the voltage difference ΔV output from the memorizer 321. The second interface 381 receives the externally input digital voltage signal Vdate. The third interface 382 and the digital-analog converter 323 are coupled. Specifically, the sequence controller 38 compensates the digital voltage signal Vdate by the voltage difference ΔV to form a new digital voltage signal to be transmitted to the digital-analog converter 323 by the third interface 382. For instance, ΔV at the moment is measured to be V1. Vdate is V2. And the compensated digital voltage input from the third interface of the sequence controller Vdate'=V1+V2.

Figure 4:
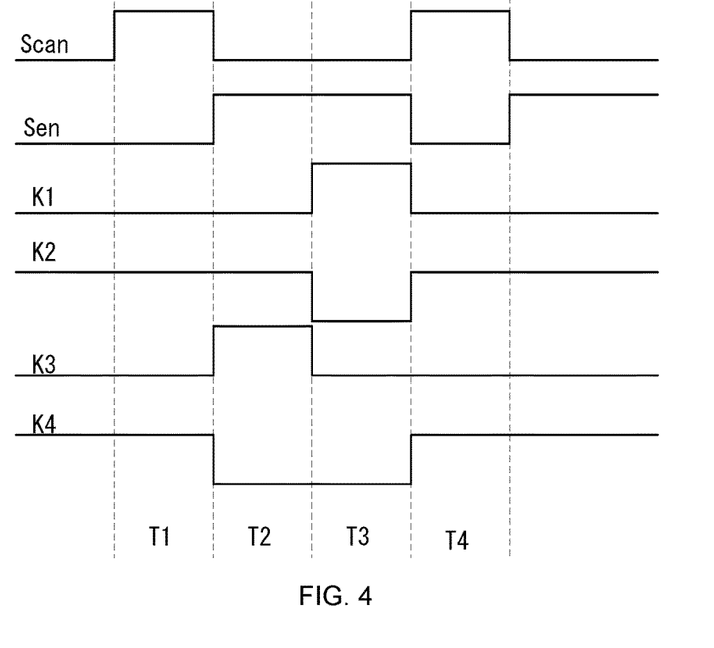
FIG. 4 is a schematic sequence diagram of an AMOLED driving circuit according to the disclosure.

In other embodiment, referring to FIG. 4, FIG. 4 is a schematic sequence diagram of an AMOLED driving circuit according to the disclosure. The first type scanning signal Scan and the second type scanning signal Sen are likewise provided by the sequence controller 38 by interfaces (not shown in FIG. 3). The first type scanning signal Scan and the second type scanning signal Sen are sequential pulse signals with the same pulse width in the corresponding cycle. The sequential pulse signals are sequential pulse signals consisting of the high level and the low level. The high levels of the first type scanning signal Scan and the second type scanning signal Sen are respectively corresponding to the pulse thereof. A pulse of the first type scanning signal Scan is earlier than the second type scanning signal Sen. In another embodiment, the sequence controller 38 is further configured to control on-off of the first switch K1, the second switch K2, the third switch K3 and the fourth switch K4 by the sequential pulse signals. As shown in FIG. 4, when the first switch K1, the second switch K2, the third switch K3 and the fourth switch K4 are high levels, a representative switch is turned on.

Referring to FIG. 3 and FIG. 4, the operational process of the driving circuit provided by the disclosure will further be illustrated in detail as follows.

The sequence controller 38 controls the first type scanning signal Scan, the second type scanning signal Sen, the first switch K1, the second switch K2, the third switch K3, and the fourth switch K4 divide the operational stages of the AMOLED pixel driving circuit into a first stage T1, a second stage T2, a third stage T3 and a fourth stage T4.

In the first stage T1, the first type scanning signal Scan is in a pulse stage. The second switch element M2 and the third switch element M3 are turned on. The second type scanning signal Sen is in a non-pulse stage. The fourth switch element M4 is turned off. The sequence controller 38 controls first switch K1 and the third switch K3 to be turned off, the second switch K2 and the fourth switch K4 to be turned on. The first node A inputs the digital voltage signal Vdate1 by the data cable 300, which means the voltage at the point A is $V_{A1}$=Vdate1. The second node B inputs the negative supply voltage VSS by the third switch element M3, which means the voltage at the point B is $V_{B1}$=VSS. The first stage T1 is a reset stage, which wipes the data of the previous frame of image.

In the second stage T2, the first type scanning signal Scan is in the non-pulse stage. The second switch element M2 and the third switch element M3 are turned off. The second type scanning signal Sen is in the pulse stage. The fourth switch element M4 is turned on. The sequence controller 38 controls the first switch K1 and the fourth switch K4 to be turned off, the second switch K2 and the third switch K3 to be turned on. The reference voltage Vref is input into the second node B by the buffer 322, which means the voltage at the second node B is $V_{B2}$=Vref, the voltage of the second node B changes Vref−VSS. The voltage of the corresponding node A is accordingly changed, $V_{A2}$=Vdate1+Vref−VSS.

In the third stage T3, the first type scanning signal Scan is in the non-pulse stage. The second switch element M2 and the third switch element M3 are turned off. The second type scanning signal Sen is in the pulse stage. The fourth switch element M4 is turned on. The sequence controller 38 controls the second switch K2, the third switch K3 and the fourth switch K4 to be turned off, the first switch K1 to be turned on. The comparator 320 detects and obtains a difference of the current I flowing through the first switch element T1 and the prospective current $I_0$ by the data cable 300, and transmits the converted voltage difference ΔV to the memorizer 321. The second stage T2 and the third stage T3 are detection stages.

In the fourth stage T4, the first type scanning signal Scan is in the pulse stage. The second switch element M2 and the third switch element M3 are turned on. The second type scanning signal Sen is in the non-pulse stage. The fourth switch element M4 is turned off. The sequence controller 38 controls the first switch K1 and the third switch K3 to be turned off, the second switch K2 and the fourth switch K4 to be turned on. The memorizer 321 transmits the voltage difference ΔV1 to the sequence controller 38. The sequence controller 38 accumulates the voltage difference ΔV1 to the digital signal voltage Vdate2. The first switch element M1 drives the organic electroluminescent device OLED to illuminate. The stage is an ordinary illumination stage. A digital voltage input in the data cable 300 at the moment is Vdate2+ΔV. The deviation of the threshold voltage of the first switch element M1 can be compensated by the manner above.

Furthermore, in a practical situation, the digital signal voltage Vdate2 input in the fourth stage T4 and the digital signal voltage Vdate1 in the detection processes of T1-T3 stages are different. The value of Vdate1 in the T1-T3 stages above is smaller than the value of the Vdate2 in the ordinary illumination stage. As a result, the current flowing through the first switch element M1 in the T1-T3 stages can hardly afford the organic electroluminescent device OLED to illuminate. In order to prevent the disturbance of the display of the AMOLED, the T1-T3 stages can process the detection at a free stage after scanning completion of the previous frame of image, or at respective initiation or shut down of the AMOLED display device. The time of the detection stage can be designed according to the practical situation.

In order to make the compensation results to be more accurate, before the fourth stage T4 that is the ordinary stage, if a current difference value obtained by the comparator 320 or the voltage difference is out of a threshold range, the operational process above further includes transmitting the voltage difference ΔV1 to the sequence controller by the memorizer 321, accumulating the voltage difference ΔV1 to the digital signal voltage Vdate1 by the sequence controller 38, repeating the processes from the first stage to the third stage until the current difference obtained by the comparator 38 or the voltage difference is in the threshold range. For instance, the first stage to the third stage above are supposed to be one cycle. In the first cycle, the comparator 320 compares to obtain the current difference at the moment is $\Delta I_1$, which is out of the threshold range. The voltage difference value $\Delta V_1$ corresponding to the current difference value $\Delta I_1$ is loaded on the digital signal voltage Vdate1 for the second cycle, which means the digital signal voltage of the first stage corresponding to the second cycle is Vdate1'=Vdate1+$\Delta V_1$. In the second cycle, the comparator 320 compares to obtain the current difference at the moment is $\Delta I_2$, which is still out of the threshold range. The voltage difference value $\Delta V_2$ corresponding to the current difference value $\Delta I_2$ is loaded on the digital signal voltage Vdate1' for the third cycle, which means the digital signal voltage of the first stage corresponding to the third cycle is Vdate1"=Vdate1+$\Delta V_1$+$\Delta V_2$. The process above is repeated until the current difference obtained by the comparator 38 is in the threshold range, since when can initiate the ordinary illumination stage, or the fourth stage T4. The digital voltage input in the data cable 300 in the fourth stage T4 is Vdate2+ΔV, where ΔV is a sum of voltage differences in each cycle, which is $\Delta V = \Delta V_1 + \ldots$.

Figure 5:
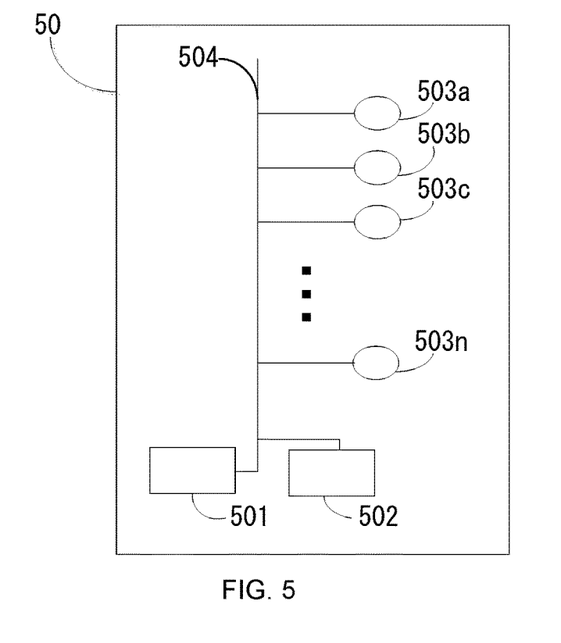
FIG. 5 is a structural schematic view of an AMOLED display device according to an embodiment of the disclosure.

Referring to FIG. 5, FIG. 5 is a structural schematic view of an AMOLED display device according to the disclosure. The schematic view merely shows a driving circuit corresponding to one data cable 504. The display device 50 includes a digital driving circuit 501, a detection circuit 502, and a plurality of pixels 503a, 503b, 503c, . . . , 503n arranged as an array. The pixels 503a, 503b, 503c, . . . , 503n include the pixel circuit in any embodiment above. The pixels 503a, 503b, 503c, . . . , 503n in one embodiment are located at the display region of the display device 50. The digital driving circuit 501 and the detection circuit 502 are located at the non-display region of the display device 50.

Overall, distinguishing from the prior art, the AMOLED driving circuit provided by the disclosure includes the detection circuit. The detection circuit and the data cable are coupled. On one hand, the detection circuit receives and outputs the current fed back from the data cable and flowing through the first switch element. The first switch element is a driving switch element of the organic electroluminescent device. The detected current is configured to subsequently compensate the threshold voltage of the first switch element, so as to enhance the display effect of the AMOLED. On the other hand, the detection circuit can simultaneously control N pixels in one column by the data cable. As the manner of progressive scanning is adopted in the AMOLED display, only one pixel is controlled by the detection circuit at one moment, which can prevent the phenomenon of abrupt change of brightness among N pixels controlled by the detection circuit and improve the display effect of the AMOLED.

The description above is merely embodiments of the disclosure, which cannot limit the protection scope of the disclosure. Any equivalent structure or process according to contents of the disclosure and the figures, or direct or indirect application in other related fields should be included in the protected scope of the disclosure.

What is claimed is:

1. An AMOLED driving circuit, comprising:
a pixel circuit, the pixel circuit comprising: an organic electroluminescent device, a cathode thereof and a negative supply voltage coupled, an anode thereof and a positive supply voltage coupled; a data cable; a first switch element, a control terminal thereof and the data cable coupled, a first passing terminal and the positive supply voltage coupled, a second passing terminal thereof and the anode coupled, the first switch element configured to drive the organic electroluminescent device to illuminate; a first capacitor, two ends of the first capacitor coupled with the control terminal of the first switch element and the second passing terminal of the first switch element respectively, and coupled positions defined as a first node and a second node respectively; a second switch element, a control terminal thereof receiving a first type scanning signal, a first passing terminal thereof and the data cable coupled, a second passing terminal thereof and the first node coupled; a third switch element, a control terminal thereof receiving the first type scanning signal, a first passing terminal thereof and the second node coupled, a second passing terminal thereof and the negative supply voltage coupled; a fourth switch element, a control terminal thereof receiving a second type scanning signal, a first passing terminal thereof and the second node coupled, a second passing terminal thereof and the data cable coupled; the first switch element, the second switch element, the third switch element, and the fourth switch element being any one of a low-temperature polysilicon thin film transistor, an oxide semiconductor thin film transistor or an amorphous silicon thin film transistor;

a detection circuit, coupled with the data cable, configured to receive and output a current fed back from the data cable and flowing through the first switch element, the current configured to compensate a threshold voltage of the first switch element; the detection circuit comprising: a first switch, coupled with the data cable; a comparator, coupled with the first switch, configured to compare the current fed back from the data cable and flowing through the first switch element and a prospective current to obtain a voltage difference; a memorizer, coupled with the comparator, configured to receive and output the voltage difference; a second switch, coupled with data cable; a buffer, comprising a normal-phase input terminal, a reversed-phase input terminal and an output terminal, the output terminal and the second switch coupled, the reversed-phase input terminal and the output terminal coupled; a third switch, one end and the normal-phase input terminal of the buffer coupled, the other end receiving an external reference voltage;

a digital driving circuit, coupled with the data cable, configured to provide a digital voltage signal to the pixel circuit by the data cable; the digital driving circuit comprising: a fourth switch, coupled with the normal-phase input terminal of the buffer; a digital-analog converter, one end and the fourth switch coupled, the other end receiving the digital voltage signal;

the detection circuit and the digital driving circuit sharing the buffer and the second switch, further coupled with the data cable of the pixel circuit, the digital driving circuit and the detection circuit integrated into one chip to achieve functions of the digital driving circuit and the detection circuit simultaneously;

wherein the AMOLED driving circuit further comprises:

a sequence controller, the sequence controller comprises a first interface, a second interface, and a third interface; the first interface and the memorizer are coupled, configured to receive the voltage difference; the second interface receives the digital voltage signal; the third interface and the digital-analog converter are coupled; the sequence controller compensates the digital voltage signal by the voltage difference to form a new digital voltage signal to be transmitted to the digital-analog converter by the third interface;

the sequence controller is configured to provide the first type scanning signal and the second type scanning signal; the first type scanning signal and the second type scanning signal are sequential pulse signals; and a pulse of the first type scanning signal is earlier than the second type scanning signal;

the sequence controller is further configured to control on-off of the first switch, the second switch, the third switch and the fourth switch;

wherein operational stages of the AMOLED pixel driving circuit comprise a first stage, a second stage, a third stage and a fourth stage according to the first type scanning signal, the second type scanning signal, the first switch, the second switch, the third switch, and the fourth switch;

in the first stage, the first type scanning signal is in a pulse stage, the second switch element and the third switch element are turned on; the second type scanning signal is in a non-pulse stage, the fourth switch element is turned off; the first switch and the third switch are turned off, the second switch and the fourth switch are turned on; the first node inputs the digital voltage signal; the second node inputs the negative supply voltage by the third switch element;

in the second stage, the first type scanning signal is in the non-pulse stage, the second switch element and the third switch element are turned off; the second type scanning signal is in the pulse stage, the fourth switch element is turned on; the first switch and the fourth switch are turned off, the second switch and the third switch are turned on; the reference voltage is input into the second node, a voltage of the first node is correspondingly to become Vdata+Vref−VSS, where Vdata is a digital voltage, Vref is the reference voltage, VSS is the negative supply voltage;

in the third stage, the first type scanning signal is in the non-pulse stage, the second switch element and the third switch element are turned off; the second type scanning signal is in the pulse stage, the fourth switch element is turned on; the second switch, the third switch and the fourth switch are turned off, the first switch is turned on; the comparator detects a difference of the current flowing through the first switch element and the prospective current by the data cable, and transmits the converted voltage difference to the memorizer;

in the fourth stage, the first type scanning signal is in the pulse stage, the second switch element and the third switch element are turned on; the second type scanning signal is in the non-pulse stage, the fourth switch element is turned off; the first switch and the third switch are turned off, the second switch and the fourth switch are turned on; the memorizer transmits the voltage difference to the sequence controller, the sequence controller accumulates the voltage difference to the digital voltage signal, the first switch element drives the organic electroluminescent device to illuminate.

2. An AMOLED driving circuit, comprising:

a pixel circuit, comprising a data cable, a first switch element and an organic electro-illuminant, the first switch element configured to drive the organic electro-illuminant to illuminate, the data cable and the first switch element coupled;

a digital driving circuit, coupled with the data cable, configured to provide a digital voltage signal to the pixel circuit by the data cable;

a detection circuit, coupled with the data cable, configured to receive and output a current fed back from the data cable and flowing through the first switch element, the current is configured to compensate a threshold voltage of the first switch element;

wherein the digital driving circuit and the detection circuit are integrated in one chip to achieve functions of the digital driving circuit and the detection circuit simultaneously;

wherein the detection circuit comprises: a first switch, coupled with the data cable; a comparator, coupled with the first switch, configured to compare the current fed back from the data cable and flowing through the first switch element and a prospective current to obtain a voltage difference; a memorizer, coupled with the comparator, configured to receive and output the voltage difference; a second switch, coupled with the data cable; a buffer, comprising a normal-phase input terminal, a reversed-phase input terminal and an output terminal, the output terminal and the second switch coupled, the reversed-phase input terminal and the output terminal coupled; a third switch, one end coupled with the normal-phase input terminal of the buffer, the other end receiving an external reference voltage;

the digital driving circuit comprising: a fourth switch, coupled with the normal-phase input terminal of the buffer; a digital-analog converter, one end coupled with the fourth switch, the other end receiving the digital voltage signal;

the detection circuit and the digital driving circuit sharing the buffer and the second switch, further coupled with the data cable of the pixel circuit;

wherein the AMOLED driving circuit further comprises:
a sequence controller, the sequence controller comprises a first interface; a second interface, and a third interface; the first interface and the memorizer are coupled, configured to receive the voltage difference; the second interface receives the digital voltage signal; the third interface and the digital-analog converter are coupled; the sequence controller compensates the digital voltage signal by the voltage difference to form a new digital voltage signal to be transmitted to the digital-analog converter by the third interface;

wherein the first switch element, a control terminal thereof and the data cable are coupled, a first passing terminal and a positive supply voltage are coupled, a second passing terminal thereof and an anode of the organic electro-illuminant are coupled; a cathode of the organic electro-illuminant and a negative supply voltage are coupled;

the pixel circuit further comprises:
a first capacitor, two ends of the first capacitor are respectively coupled with the control terminal of the first switch element and the second passing terminal of the first switch element, and coupled positions are respectively defined as a first node and a second node;
a second switch element, a control terminal thereof receives a first type scanning signal, a first passing terminal thereof and the data cable are coupled, a second passing terminal thereof and the first node are coupled;
a third switch element, a control terminal thereof receives the first type scanning signal, a first passing terminal thereof and the second node are coupled, a second terminal thereof and the negative supply voltage are coupled;
a fourth switch element, a control terminal thereof receives a second type scanning signal, a first passing terminal thereof and the second node are coupled, a second passing terminal thereof and the data cable are coupled;

wherein operational stages of the AMOLED pixel driving circuit comprise a first stage, a second stage, a third stage and a fourth stage according to the first type scanning signal, the second type scanning signal, the first switch, the second switch, the third switch, and the fourth switch;

in the first stage, the first type scanning signal is in a pulse stage, the second switch element and the third switch element are turned on; the second type scanning signal is in a non-pulse stage, the fourth switch element is turned off; the first switch and the third switch are turned off, the second switch and the fourth switch are turned on; the first node inputs the digital voltage signal; the second node inputs the negative supply voltage by the third switch element;

in the second stage, the first type scanning signal is in the non-pulse stage, the second switch element and the third switch element are turned off; the second type scanning signal is in the pulse stage, the fourth switch element is turned on; the first switch and the fourth switch are turned off, the second switch and the third switch are turned on; the reference voltage is input into the second node, a voltage of the first node is correspondingly to become Vdata+Vref−VSS, where Vdata is a digital voltage, Vref is the reference voltage, VSS is the negative supply voltage;

in the third stage, the first type scanning signal is in the non-pulse stage, the second switch element and the third switch element are turned off; the second type scanning signal is in the pulse stage, the fourth switch element is turned on; the second switch, the third switch and the fourth switch are turned off, the first switch is turned on; the comparator detects a difference of the current flowing through the first switch element and the prospective current by the data cable, and transmits the converted voltage difference to the memorizer;

in the fourth stage, the first type scanning signal is in the pulse stage, the second switch element and the third switch element are turned on; the second type scanning signal is in the non-pulse stage, the fourth switch element is turned off; the first switch and the third switch are turned off, the second switch and the fourth switch are turned on; the memorizer transmits the voltage difference to the sequence controller, the sequence controller accumulates the voltage difference to the digital voltage signal, the first switch element drives the organic electroluminescent device to illuminate.

3. The AMOLED driving circuit according to claim 2, wherein the first type scanning signal and the second type scanning signal are provided by the sequence controller; the first type scanning signal and the second type scanning signal are sequential pulse signals; and a pulse of the first type scanning signal is earlier than the second type scanning signal.

4. The AMOLED driving circuit according to claim 2, wherein the sequence controller is further configured to control on-off of the first switch, the second switch, the third switch and the fourth switch.

5. The AMOLED driving circuit according to claim 2, wherein if a current difference obtained by the comparator or the voltage difference is out of a threshold range, it is further comprised before the fourth stage that:
the memorizer transmits the voltage difference to the sequence controller, the sequence controller accumulates the voltage difference to the digital signal voltage, processes from the first stage to the third stage are repeated until the current difference obtained by the comparator or the voltage difference is in the threshold range.

6. An AMOLED display device,
the display device comprising a digital driving circuit, a detection circuit, a data cable and a plurality of pixels arranged as an array, the pixels comprising a pixel circuit, the pixel circuit comprising: a first switch element and an organic electro-illuminant, the first switch element respectively coupled with the organic electro-illuminant and the data cable;

the digital driving circuit coupled with the data cable, configured to provide a digital voltage signal to the pixel circuit by the data cable;

the detection circuit coupled with the data cable, configured to receive and output a current fed back from the data cable and flowing through the first switch element, the current configured to compensate a threshold voltage of the first switch element;

wherein the digital driving circuit and the detection circuit are integrated in one chip to achieve functions of the digital driving circuit and the detection circuit simultaneously;

wherein the detection circuit comprises: a first switch, coupled with the data cable; a comparator, coupled with the first switch, configured to compare the current fed back from the data cable and flowing through the first switch element and a prospective current to obtain a voltage difference; a memorizer, coupled with the comparator, configured to receive and output the voltage difference; a second switch, coupled with the data cable; a buffer, comprising a normal-phase input terminal, a reversed-phase input terminal and an output terminal, the output terminal and the second switch coupled, the reversed-phase input terminal and the output terminal coupled; a third switch, one end coupled with the normal-phase input terminal of the buffer, the other end receiving an external reference voltage;

the digital driving circuit comprising: a fourth switch, coupled with the normal-phase input terminal of the buffer; a digital-analog converter, one end coupled with the fourth switch, the other end receiving the digital voltage signal;

the detection circuit and the digital driving circuit sharing the buffer and the second switch, further coupled with the data cable of the pixel circuit;

wherein the AMOLED driving circuit further comprises:

a sequence controller, the sequence controller comprises a first interface; a second interface, and a third interface; the first interface and the memorizer are coupled, configured to receive the voltage difference; the second interface receives the digital voltage signal; the third interface and the digital-analog converter are coupled; the sequence controller compensates the digital voltage signal by the voltage difference to form a new digital voltage signal to be transmitted to the digital-analog converter by the third interface;

wherein the first switch element, a control terminal thereof and the data cable are coupled, a first passing terminal and a positive supply voltage are coupled, a second passing terminal thereof and an anode of the organic electro-illuminant are coupled; a cathode of the organic electro-illuminant and a negative supply voltage are coupled;

the pixel circuit further comprises:

a first capacitor, two ends of the first capacitor are respectively coupled with the control terminal of the first switch element and the second passing terminal of the first switch element, and coupled positions are respectively defined as a first node and a second node;

a second switch element, a control terminal thereof receives a first type scanning signal, a first passing terminal thereof and the data cable are coupled, a second passing terminal thereof and the first node are coupled;

a third switch element, a control terminal thereof receives the first type scanning signal, a first passing terminal thereof and the second node are coupled, a second terminal thereof and the negative supply voltage are coupled;

a fourth switch element, a control terminal thereof receives a second type scanning signal, a first passing terminal thereof and the second node are coupled, a second passing terminal thereof and the data cable are coupled;

wherein operational stages of the AMOLED pixel driving circuit comprise a first stage, a second stage, a third stage and a fourth stage according to the first type scanning signal, the second type scanning signal, the first switch, the second switch, the third switch, and the fourth switch;

in the first stage, the first type scanning signal is in a pulse stage, the second switch element and the third switch element are turned on; the second type scanning signal is in a non-pulse stage, the fourth switch element is turned off; the first switch and the third switch are turned off, the second switch and the fourth switch are turned on; the first node inputs the digital voltage signal; the second node inputs the negative supply voltage by the third switch element;

in the second stage, the first type scanning signal is in the non-pulse stage, the second switch element and the third switch element are turned off; the second type scanning signal is in the pulse stage, the fourth switch element is turned on; the first switch and the fourth switch are turned off, the second switch and the third switch are turned on; the reference voltage is input into the second node, a voltage of the first node is correspondingly to become Vdata+Vref-VSS, where Vdata is a digital voltage, Vref is the reference voltage, VSS is the negative supply voltage;

in the third stage, the first type scanning signal is in the non-pulse stage, the second switch element and the third switch element are turned off; the second type scanning signal is in the pulse stage, the fourth switch element is turned on; the second switch, the third switch and the fourth switch are turned off, the first switch is turned on; the comparator detects a difference of the current flowing through the first switch element and the prospective current by the data cable, and transmits the converted voltage difference to the memorizer;

in the fourth stage, the first type scanning signal is in the pulse stage, the second switch element and the third switch element are turned on; the second type scanning signal is in the non-pulse stage, the fourth switch element is turned off; the first switch and the third switch are turned off, the second switch and the fourth switch are turned on; the memorizer transmits the voltage difference to the sequence controller, the sequence controller accumulates the voltage difference to the digital voltage signal, the first switch element drives the organic electroluminescent device to illuminate.

7. The display device according to claim 6, wherein the sequence controller is configured to provide the first type scanning signal and the second type scanning signal; the first type scanning signal and the second type scanning signal are sequential pulse signals; and a pulse of the first type scanning signal is earlier than the second type scanning signal;

the sequence controller is further configured to control on-off of the first switch, the second switch, the third switch and the fourth switch.

8. The display device according to claim 6, wherein if a current difference obtained by the comparator or the voltage difference is out of a threshold range, it is further comprised before the fourth stage that:

the memorizer transmits the voltage difference to the sequence controller, the sequence controller accumulates the voltage difference to the digital signal voltage, processes from the first stage to the third stage are repeated until the current difference obtained by the comparator or the voltage difference is in the threshold range.

* * * * *